United States Patent [19]

Chaudhary

[11] 4,253,056
[45] Feb. 24, 1981

[54] GROUND FAULT DETECTOR FOR DC POWER SUPPLY

[75] Inventor: Rashid A. Chaudhary, Owen Sound, Canada

[73] Assignee: General Signal Corporation, Stamford, Conn.

[21] Appl. No.: 60,528

[22] Filed: Jul. 25, 1979

[51] Int. Cl.³ .......................................... G01R 31/02
[52] U.S. Cl. ................................ 324/51; 324/140 R; 324/DIG. 1
[58] Field of Search ............... 324/51, 52, 62 R, 140, 324/DIG. 1; 340/255, 248 A

[56] References Cited

U.S. PATENT DOCUMENTS

| | | | |
|---|---|---|---|
| 3,801,898 | 4/1974 | Young | 324/51 |
| 4,002,968 | 1/1977 | Reid | 324/51 |

*Primary Examiner*—David K. Moore
*Attorney, Agent, or Firm*—Milton E. Kleinman; George W. Killian

[57] ABSTRACT

A detector circuit for detecting an unwanted ground coupled to either terminal of an ungrounded d.c. power supply. The circuit uses simple and economical components including four resistors, two diodes and a single voltage comparator. The resistors provide two voltage dividers whose midpoints are at different potentials. The two midpoints are coupled by the two diodes in series with the midpoint of the diodes grounded. A voltage comparator is coupled to the voltage divider midpoints. Any unwanted ground will shift the relative polarity of the voltage divider midpoints and alter the output signal of the voltage comparator.

8 Claims, 1 Drawing Figure

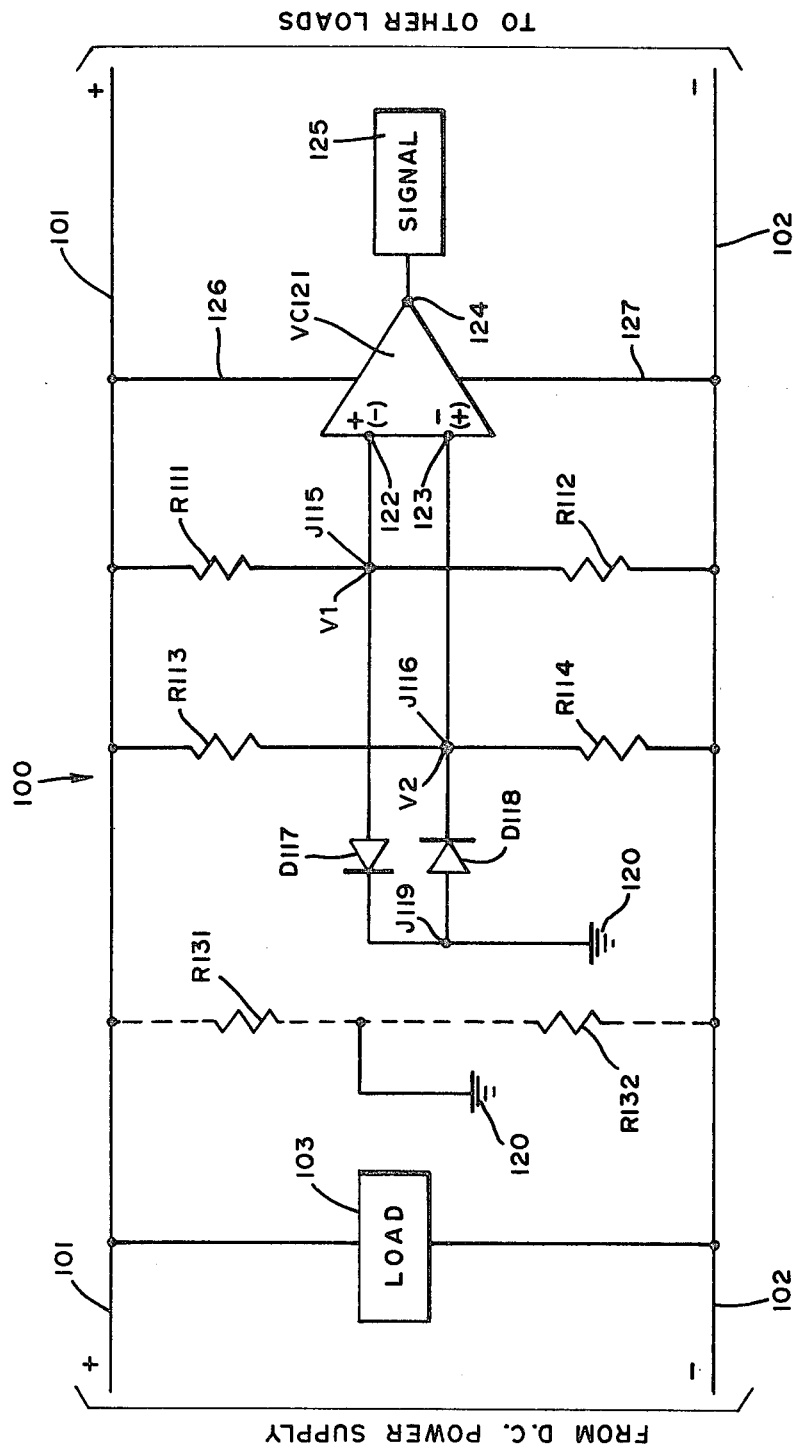

GROUND FAULT DETECTOR FOR DC POWER SUPPLY

BACKGROUND OF THE INVENTION

It is well known that some power distribution systems employ an earth ground. For example, one wire of the standard household 110 volt system is directly connected to an earth ground. However, in specialized applications, a 110 volt system can be provided that is entirely isolated from ground. The same situation is found in d.c. systems wherein some employ a grounded system and some are isolated from ground. For example, in a standard automobile one pole of the 12 volt battery is directly connected to the chassis of the automobile and referred to as ground. DC power supplies which are intended to be isolated from either a chassis and/or earth ground may cause equipment malfunctions if one pole or the other is inadvertently or unintentionally grounded. Accordingly, many techniques and devices have been organized for detecting and responding to an unwanted ground on either terminal of a d.c. power supply. For example, U.S. Pat. No. 4,002,968, issued Jan. 11, 1977, to Ian Reid and assigned to the same assignee as the present invention discloses a ground fault detector for a 2-wire power supply. U.S. Pat. No. 3,801,898, issued Apr. 2, 1974, to John A. Young illustrates another circuit for detecting a resistive path to ground on either terminal of a d.c. power supply. The application of Mande et al., Ser. No. 902,030, filed May 2, 1978 and issued as U.S. Pat. No. 4,198,625 on Apr. 15, 1980, and assigned to the same assignee as the present invention, discloses a detection scheme for responding to differences in potential levels. A false ground on either leg of a d.c. power supply which should be isolated from ground may derogate the system, causing malfunctions and improper operation.

Prior art systems have been designed which are reliable and effective but which sometimes require numerous and/or expensive components and/or require adjustment or balance. This has made such systems expensive to manufacture, expensive to maintain, difficult to adjust, and/or inconvenient to repair.

SUMMARY OF THE INVENTION

The ground fault detector circuit disclosed herein is a simple, convenient and economical circuit for detecting and responding to a false ground on either bus of a d.c. power supply. The circuit comprises two voltage dividers each comprising two simple and economical standard tolerance resistors, two simple diodes, and a voltage comparator. The resistors for the voltage dividers are selected so that the midpoints of the voltage dividers are at different potentials. The diodes are coupled in series with like polarity between the midpoints of the two voltage dividers, and the junction point between the two diodes is grounded. A voltage comparator is also coupled between the two midpoints of the voltage dividers. In response to a false ground on either bus of the d.c. power supply, the polarity relationship of the midpoints of the two voltage dividers will reverse, thereby altering the output of the voltage comparator. The altered output of the voltage comparator can provide a signal in the well-known manner.

It is an object of the invention to provide a new and improved ground fault detector for a d.c. power supply.

It is a more specific object of the invention to provide an improved ground fault detector for a d.c. power supply which is simpler and more economical than prior art structures.

It is another object of the present invention to provide the aforementioned features by use of a circuit having a minimum number of components.

It is another object of the invention to provide a ground fault detector which uses standard tolerance components.

It is another object of the invention to provide a detector as described which is simple and economical to manufacture and maintain.

BRIEF DESCRIPTION OF THE DRAWING

To permit an orderly and detailed analysis of the operational characteristics of the circuit, a schematic diagram has been provided as an aid in understanding the invention, and standard electrical symbols and notations have been used. To selected elements have been assigned mnemonic designators.

The drawing comprises a single schematic circuit of the ground fault detector for a d.c. power supply.

DESCRIPTION OF THE PREFERRED EMBODIMENT

Referring now more particularly to the drawing, there is depicted a circuit indicated generally as 100 which is designed to detect and respond to a ground fault on either bus of a d.c. power supply. The circuit includes a positive bus 101 and a negative bus 102. The d.c. power supply per se is not illustrated but is presumed to be coupled to the busses 101 and 102 at the left. Coupled between the positive and negative busses 101 and 102, respectively, is a load 103 which may comprise any device. The potential between the d.c. busses 101 and 102 is not indicated and may have any suitable value as may be required for the particular application. For example, the system might be used in a fire alarm system employing a d.c. potential of the order of 24 volts. For other applications the d.c. potential might be greater or smaller. Additional loads could be connected between the busses 101 and 102 at the right-hand ends thereof, as shown in the drawing.

The ground fault detector comprises first and second voltage dividers with the first voltage divider including resistors R111 and R112 and the second voltage divider comprising resistors R113 and R114. As seen, the voltage dividers are coupled between the positive and negative busses 101 and 102. The common junction of the first voltage divider between resistors R111 and R112 is designated as junction J115. In like manner, the junction between the two resistors R113 and R114 of the second voltage divider is designated J116. Coupled between the junctions J115 and J116 are two diodes, D117 and D118. As may be seen from the schematic drawing, diodes D117 and D118 are coupled in series with a junction therebetween designated J119. The diodes D117 and D118 are poled alike to pass conventional current from junction J115 to junction J116. The junction J119 is coupled to ground 120, which may comprise either a chassis or earth ground.

Also coupled between the junctions J115 and J116 is a voltage comparator VC121 having input terminals 122 and 123 and an output terminal 124. Coupled to the output terminal 124 is a signal device 125. As will be shown hereinbelow, the input terminals 122 and 123 may be either positive and negative, respectively, or negative and positive, respectively. Accordingly, terminal 122 is designated + and (−) and terminal 123 is designated − and (+). In one configuration the terminals 122 and 123 should be considered to be poled as indicated without the parentheses, and in another configuration the terminals 122 and 123 should be considered to be poled as indicated with the parentheses.

The circuit 100 is designed to detect ground faults accidentally or inadvertently coupled to one of the busses 101 or 102. For the purposes of this description a ground fault may be defined as an unwanted current path from ground through a circuit which may or may not include resistive or impedance elements. For circuit analysis, a resistor 131 is shown as possibly coupled between the bus 101 and the ground 120. In a similar manner, a ground which may be accidentally or inadvertently coupled between the negative bus 102 and ground 120 is indicated as R132. The connections to both of these resistors are shown through dotted lines to indicate that they may or may not be connected in the circuit.

It should be understood that the two points designated 120 respresent ground and that this ground may comprise a chassis ground, a building ground, or an earth ground, or any combination thereof.

The following discussion will explain the operation of the circuit during normal conditions, wherein neither the resistor R131 or the resistor R132 is connected. That is, there is no ground fault on either the positive or negative bus 101 or 102, respectively. The resistors R111, R112, R113 and R114 for the first and second voltage dividers are selected such that the junction point J115 has a potential V1 with respect to the negative bus 102 that is greater than the potential V2 of junction J116 with respect to the negative bus 102. This may be easily and readily achieved by, for example, using 33K resistors for resistor R111 and resistor R114 and 47K resistors for resistors R112 and R113. In order to provide the most economical circuit, it is expedient to use resistors for the resistors R111 through R114 from standard resistors selected such that as long as the resistors are within tolerance the voltage V1 at junction point J115 will be greater than the voltage V2 at junction point J116 by at least a predetermined amount to be described more fully hereinbelow. Naturally, the potential difference just named will be a function of the actual value of the resistors R111-R114 and the value of the d.c. potential between the busses 101 and 102. The diodes D117 and D118 are poled to pass current from the higher to the lower potential and will cause the potentials between junction J115 and J116 to be less than or equal to the sum of the forward voltage drop of the diodes D117 and D118 but greater than the input offset voltage of the comparator. Typically, the forward voltage drop of the diode is 0.7 volts, and the input offset voltage of the comparator is of the order of a few millivolts. Therefore, under normal conditions the potential between junction points J115 and J116 will be less than or equal to 1.4 volts, but greater than the input offset voltage of the comparator. To the extent that the potential between the junction points J115 and J116 might tend to be more than 1.4 volts without the diodes D117 and D118, the diodes will cause a current to flow therethrough to provide the voltage difference named above. That is, current from the positive bus 101 will pass through resistor R111 to junction point J115 and thence through the diodes D117 and D118 in series through resistor R114 to the negative bus 102. In addition, some current from the positive bus 101 will flow through resistor R111 to junction point J115 and through resistor R112 to the negative bus 102. This has the effect of stabilizing the potential between the junction points J115 and J116 at a potential of 1.4 volts.

The input offset voltage mentioned above may be defined as the minimum potential differential which must be exceeded between the two inputs of the voltage comparator to trigger it from one state to the other. The input offset voltage may be of the order of a few millivolts. It should be understood that a potential difference of one polarity will trigger the voltage comparator from ON to OFF and that a potential difference of the opposite polarity will trigger the voltage comparator from OFF to ON.

As suggested above, the junctions J115 and J116 are connected to the input terminals 122 and 123, respectively, of the voltage comparator VC121. The following description will presume that the input terminals 122 and 123 are positive and negative, respectively, as indicated without parentheses. It should be remembered that the immediately following circuit description relates to the operation with input terminals 122 and 123 being positive and negative, respectively.

Under the named conditions, that is, with no fault or inadvertent connection between either bus 101 or 102 and ground 120, junction J115 will be positive with respect to junction J116; and therefore the positive input terminal 122 of the voltage comparator VC121 will be positive with respect to the negative input terminal 123. As will be seen, the voltage comparator VC121 has a lead 126 coupled to the positive d.c. bus 101 and a lead 127 connected to the negative d.c. bus 102. It is characteristic of a voltage comparator that when the positive input terminal is positive with respect to the negative input terminal, the output of the comparator is deactivated and the comparator is referred to as being "off". When the positive input terminal 122 of the voltage comparator VC 121 is negative with respect to the negative input terminal 123, the output terminal 124 will be activated and the comparator VC121 is referred to as being "on". Accordingly, under one condition of the voltage comparator VC121, the signal device 125 will be off; and, under another condition of the voltage comparator VC121, the signal device 125 will be on. It will be shown hereinbelow that a connection between the ground 120 and either of the d.c. busses 101 or 102 will cause the voltage comparator VC121 to shift state and thereby enable the signal device 125 to change its state and provide any appropriate signal which may comprise actuation of a relay, illumination of a lamp, sounding of a horn or bell, or any other appropriate alarm signal or combination thereof.

Actuation with Ground on the Positive Bus

Consideration will now be given to the circuit actuation in response to a false ground on the positive bus 101. First it should be remembered that under normal conditions, for the case under consideration, the output terminal 124 of the voltage comparator VC121 will be open when the input terminal 122 is positive with respect to the input terminal 123, and that output terminal 124 will be at ground potential when the input terminal 122 is negative with respect to the input terminal 123. If it is assumed that there is a resistor R131, below a predetermined magnitude, coupled between the positive bus 101 and the ground 120, it will be evident that a current may flow from the positive bus 101, through the resistor R131, to ground 120, and thence through diode D118 and resistor R114 to the negative bus 102. This will, in effect, shunt resistor R113 and cause an increased current in resistor 114 and therefore an increased voltage drop across resistor R114. In view of the increased voltage drop across resistor R114, the potential of junction point J116 will be made more positive. If the fault resistor R131 is below a predetermined value, the potential of junction point J116 can rise above the potential of junction point J115, thereby causing the input terminal 123 of the voltage comparator VC121 to be more positive than the input terminal 122, thereby activating the output terminal 124 and actuating the signal 125.

Actuation with Ground on the Negative Bus

A false ground on the negative bus 102 of the d.c. power supply will, in effect shunt resistor R112 and cause an increased current in the resistor R111 and therefore an increased voltage drop across resistor R111. In response to the increased voltage drop across resistor R111 the potential of junction point J115 will be lowered. If the fault resistor R132 is below a predetermined value the potential of junction point J115 will be below that of junction point J116. The net result will be that the relative potential of the junction points J115 and J116 will reverse; and the input terminal 122 of the votage comparator VC121 will be negative with respect to the input terminal 123, and therefore the output terminal 124 will be activated thereby affecting the signal 125, as previously described.

The sensitivity of the circuit 100 to false grounds on either bus 101 or 102 may be increased by increasing the value of the resistors R111–R114. Conversely, the sensitivity may be reduced by reducing the value of the resistors R111–R114. In addition, the circuit 100 may be made selectively more sensitive to grounds on the positive bus 101 or on the negative bus 101 or the negative bus 102, respectively.

Another method of altering the sensitivity of the circuit 100 would be to add onr or more extra diodes in series with the existing diodes. This would tend to reduce the sensitivity of the circuit 100 to false grounds.

Alternate Configuration

In an alternate configuration the input terminals 122 and 123 of the voltage comparator VC121 may be negative and positive, respectively, as indicated by the negative and positive symbols within parentheses.

As in the prior configuration, the resistors R111–R114 are selected to result in junction J115 being positive with respect to junction J116. Thus, under normal conditions, the more positive junction J115 is coupled to the negative input terminal 122 of the voltage comparator VC121 and the more negative junction J116 is coupled to the positive input terminal 123 of the voltage comparator VC121. This comprises the condition for the voltage comparator VC121 to be "on". Thus, in this alternate configuration, the voltage comparator VC121 is "on" under normal (i.e., no ground) conditions; whereas, in the other configuration, the voltage comparator VC121 is "off" under normal conditions.

In this alternate configuration a false ground on bus 101 or 102 will shift the relative potentials between junctions J115 and J116 just as before. But in the alternate configuration the voltage comparator VC121 will be switched from "on" to "off" rather than from "off" to "on".

Note that in both configurations the diodes D117 and D118 are poled to pass current from the more positive junction J115 to the more negative junction J116 when there is no false ground.

While there has been shown and described what is considered at present to be a preferred embodiment of the invention, modifications thereto will readily occur to those skilled in the related arts. For example, other forms of voltage comparators or unidirectional current devices could be employed. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiment shown or described, and it is intended to cover in the appended claims all such modifications as fall within the true spirit and scope of the invention.

What is claimed is:

1. A ground fault detector for an ungrounded d.c. power supply having a positive and a negative lead and comprising in combination;
    (a) a first voltage divider coupled between the positive and negative leads with a first intermediate terminal having a positive potential of V1 with respect to said negative lead;
    (b) a second voltage divider coupled between the positive and negative leads with a second intermediate terminal having a positive potential of V2 with respect to said negative lead and wherein the relationship of said first and second voltage dividers causes said potential V1 to be more positive than said potential V2;
    (c) first and second diodes connected in series with like polarity and coupled between said first and second intermediate terminals and with the common junction of said series connected diodes coupled to ground; and
    (d) a comparator coupled to said first and second intermediate terminals for producing a first output when said potentials V1 and V2 have said named relationship.

2. The combination as set forth in claim 1 wherein said diodes are poled to pass forward current from said first to said second intermediate terminal.

3. The combination as set forth in claim 2 wherein said potential V1 is greater than said potential V2 by an amount between the sum of the rated forward voltage drop across said diodes and the input offset voltage of the comparator.

4. The combination as set forth in claim 1 wherein an impedance below a predetermined magnitude coupled between ground and one or the other of said positive or negative leads produces a change in the relationship of said potentials V1 and V2 whereby said potential V2 is greater than said potential V1 by an amount equal at least to the input offset voltage of said comparator.

5. The combination as set forth in claim 4 wherein said comparator produces a second output in response to said potential V2 exceeding said potential V1 by an amount equal to at least the input offset voltage of said comparator.

6. The combination as set forth in claim 1 wherein said comparator produces a second output in response to said potentials V1 and V2 having a relationship wherein said potential V2 is greater than said potential V1 by an amount equal to at least the input offset voltage of said comparator.

7. The combination as set forth in claim 6 wherein said diodes are poled to pass forward current from said first to said second intermediate terminal.

8. The combination as set forth in claim 7 wherein an impedance less than a predetermined magnitude which is coupled between ground and one or the other of the positive or negative leads of the d.c. power supply produces a change in the relationship of said potentials V1 and V2 wherein said potential V2 is greater than said potential V1 by an amount equal to at least the input offset voltage of said comparator.

* * * * *